(12) United States Patent
Higashitsutsumi

(10) Patent No.: US 10,574,872 B2
(45) Date of Patent: Feb. 25, 2020

(54) METHODS AND APPARATUS FOR SINGLE-CHIP MULTISPECTRAL OBJECT DETECTION

(71) Applicant: SEMICONDUCTOR COMPONENTS INDUSTRIES, LLC, Phoenix, AZ (US)

(72) Inventor: Yoshihito Higashitsutsumi, Koto-ku (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 250 days.

(21) Appl. No.: 15/366,113

(22) Filed: Dec. 1, 2016

(65) Prior Publication Data

US 2018/0158208 A1 Jun. 7, 2018

(51) Int. Cl.
| | | |
|---|---|---|
| *H04N 5/225* | (2006.01) | |
| *G02B 5/20* | (2006.01) | |
| *G03B 11/00* | (2006.01) | |
| *G02B 3/00* | (2006.01) | |
| *H01L 27/146* | (2006.01) | |
| *G03B 15/05* | (2006.01) | |

(52) U.S. Cl.
CPC ......... *H04N 5/2256* (2013.01); *G02B 3/0056* (2013.01); *G02B 5/20* (2013.01); *G03B 11/00* (2013.01); *G03B 15/05* (2013.01); *H01L 27/14621* (2013.01); *H01L 27/14625* (2013.01); *H01L 27/14627* (2013.01)

(58) Field of Classification Search
CPC ........ G02B 3/0056; G02B 5/20; G03B 11/00; G03B 13/32; H01L 27/14621; H01L 27/14625; H01L 27/14627; H04N 5/2256
See application file for complete search history.

(56) References Cited

U.S. PATENT DOCUMENTS

| | | |
|---|---|---|
| 6,810,135 B1 | 10/2004 | Berenz et al. |
| 7,061,532 B2 | 6/2006 | Silverstein |
| 8,139,116 B2 | 3/2012 | Murayama |

(Continued)

OTHER PUBLICATIONS

Ito et al., "Skin Detection Method by Using Multi-Infrared Light Under the Sunlight." In Journal of the Japan Society for Precision Engineering, vol. 79, Issue 11, Nov. 2013, pp. 1083-1088, Japan.

*Primary Examiner* — Francis Geroleo
(74) *Attorney, Agent, or Firm* — Treyz Law Group, P.C.; Tianyi He

(57) ABSTRACT

An imaging system may include an array of pixel blocks that each have multiple pixels over which a single microlens is formed. A lens system may be formed over the multiple pixels. The lens system may have an aperture and a filter system, which includes multiple portions each corresponding to a pixel of the multiple pixels, formed at the aperture. The multiple portions may have multiple band pass filters of different wavelengths. During imaging operations, a light emitting diode of a given wavelength may be used to brighten an object for detection. A band pass filter may correspond to the given wavelength of the light emitting diode. Subtraction circuitry may subtract signals obtained using a band pass filter from signals obtained using the band pass filter corresponding to the given wavelength to generate object detection data.

17 Claims, 10 Drawing Sheets

(56) References Cited

U.S. PATENT DOCUMENTS

| | | |
|---|---|---|
| 8,742,309 B2 | 6/2014 | Agranov et al. |
| 9,338,380 B2 | 5/2016 | Mlinar |
| 2013/0222552 A1 | 8/2013 | Agranov et al. |
| 2015/0062422 A1 | 3/2015 | Stern |
| 2015/0237273 A1* | 8/2015 | Sawadaishi .......... H04N 5/3572 348/234 |
| 2015/0319412 A1* | 11/2015 | Koshiba ................ H04N 5/367 348/246 |
| 2016/0286108 A1 | 9/2016 | Fettig et al. |
| 2017/0034456 A1* | 2/2017 | Kyung ................... H04N 5/332 |
| 2017/0054910 A1* | 2/2017 | Moriuchi ........... H04N 5/23267 |
| 2017/0264811 A1* | 9/2017 | Ollila ................ H04N 5/23212 |

* cited by examiner

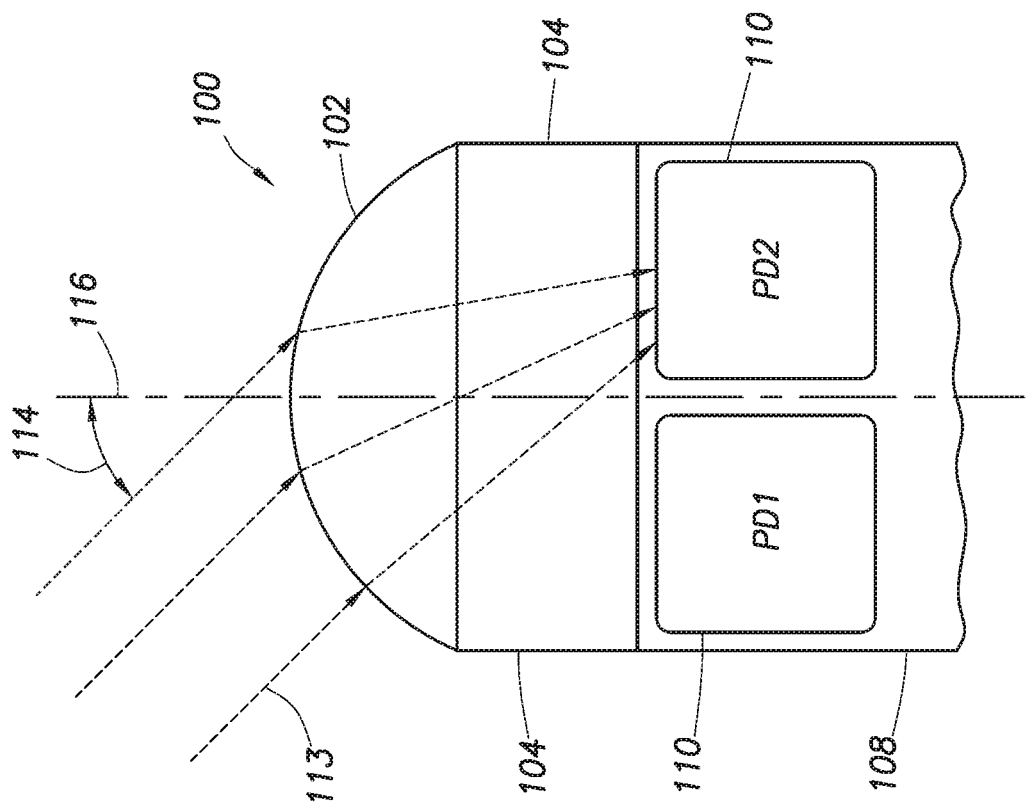
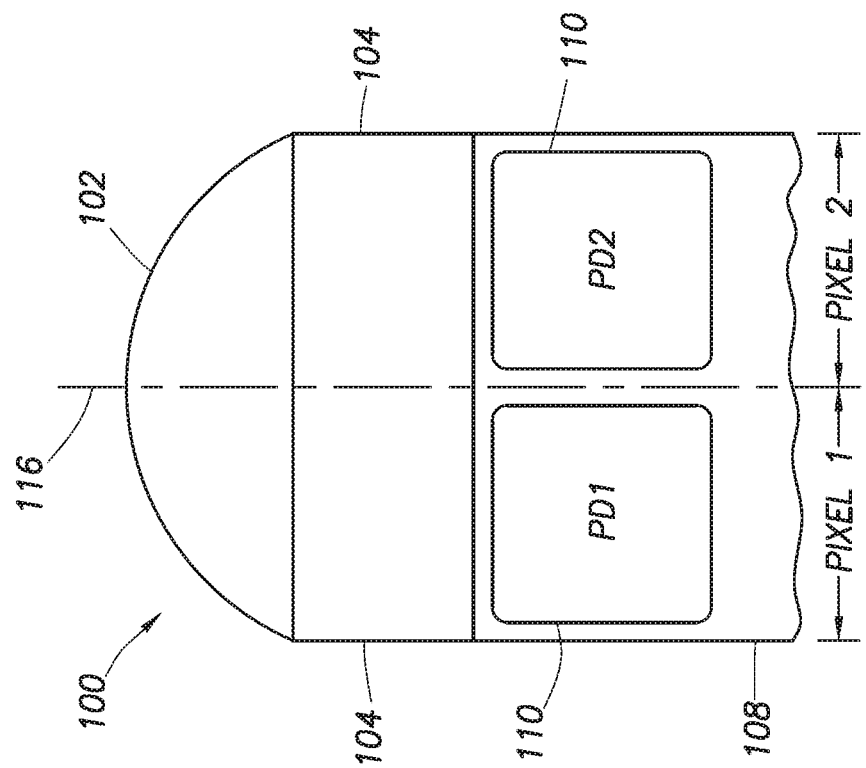

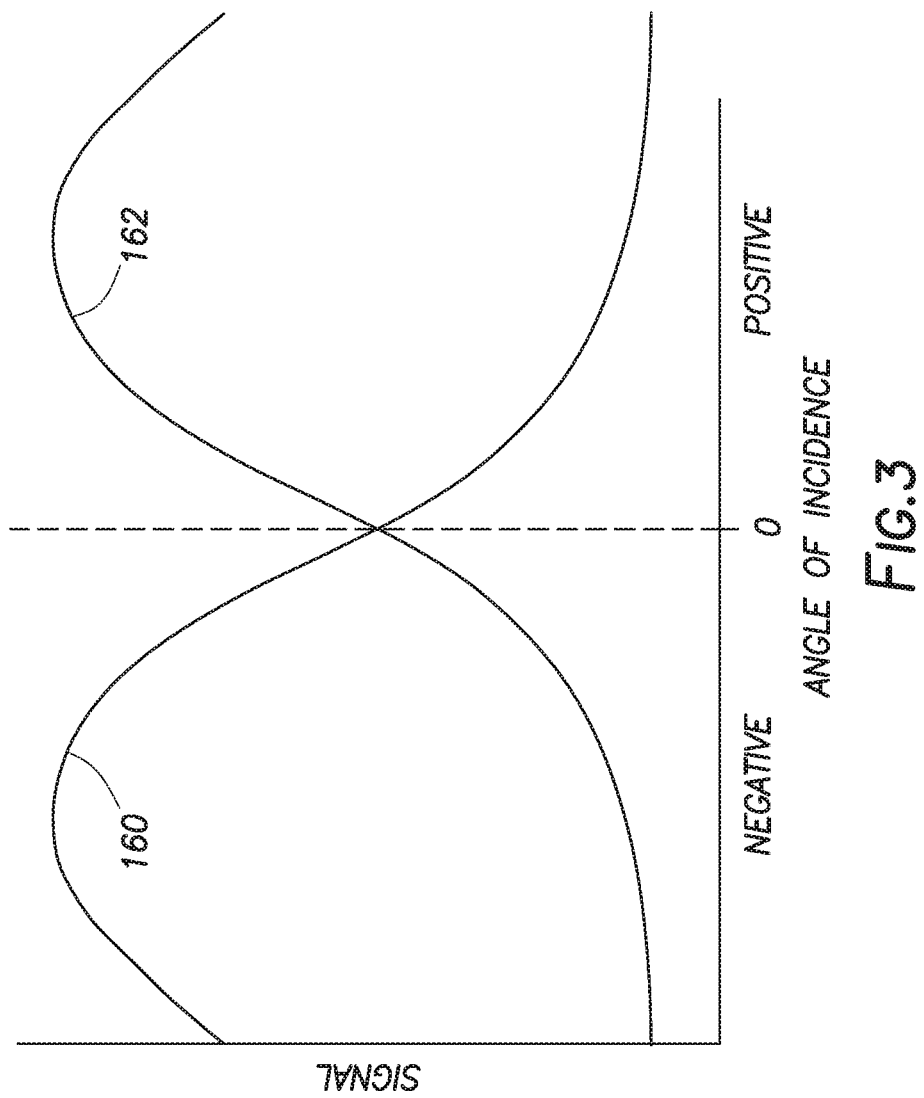

METHODS AND APPARATUS FOR SINGLE-CHIP MULTISPECTRAL OBJECT DETECTION

BACKGROUND

This relates generally to imaging systems and, more particularly, to imaging systems with object detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals.

Some applications such as face recognition may require generating a first frame image using an image sensor accompanied with natural lighting and a second frame image using the image sensor in a subsequent frame with lighting from a light-emitting diode (LED). The first image is stored at a frame memory, while the second image is being generated. After the second frame image is generated, the first frame image may be subtracted from the second frame image to enable face recognition. Due to the addition of components such as the frame memory, these arrangements lead to reduced frame rate, increased power consumption, and increased complexity.

It would therefore be desirable to be able to provide improved imaging systems with object detection capabilities.

BRIEF DESCRIPTION OF THE DRAWINGS

FIG. 2A is a cross-sectional side view of illustrative phase detection pixels having photosensitive regions with different and asymmetric angular responses in accordance with an embodiment of the present invention.

FIGS. 2B and 2C are cross-sectional views of the phase detection pixels of FIG. 2A in accordance with an embodiment of the present invention.

FIG. 3 is a diagram of illustrative signal outputs of photosensitive regions of depth sensing pixels for incident light striking the depth sensing pixels at varying angles of incidence in accordance with an embodiment of the present invention.

DETAILED DESCRIPTION

Figure 1:
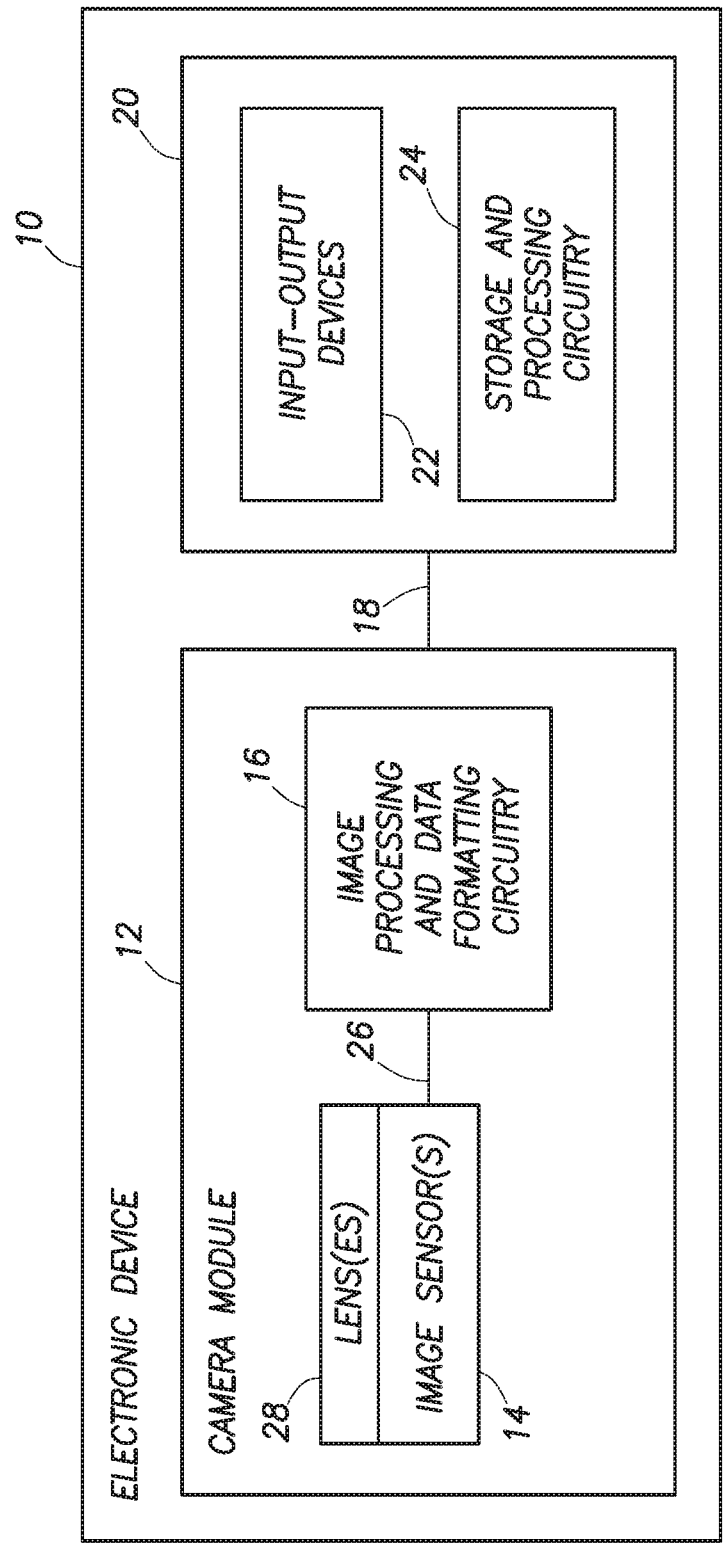
FIG. 1 is a schematic diagram of an illustrative electronic device with an image sensor that may include phase detection pixels in accordance with an embodiment of the present invention.

Embodiments of the present invention relate to image systems with object detection functionalities and depth sensing capabilities. An electronic device with a digital camera module is shown in FIG. 1. Electronic device 10 may be a digital camera, a computer, a cellular telephone, a medical device, or another electronic device. Camera module 12 (sometimes referred to as an imaging device) may include image sensor 14 and one or more lenses 28. During operation, lenses 28 (sometimes referred to as optics 28, macro-lens 28, lens system 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as object detection, automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide imaging systems with object detection capabilities (e.g., to use in driver monitoring systems, skin detection for medical use, 3D imaging applications such as machine vision applications, etc.). To provide object detection capabilities, image sensor 14 may include phase detection pixel blocks such as phase detection pixel block 100 shown in FIG. 2A.

FIG. 2A is an illustrative cross-sectional view of pixel block 100. In FIG. 2A, phase detection pixel block 100 is a pixel pair. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
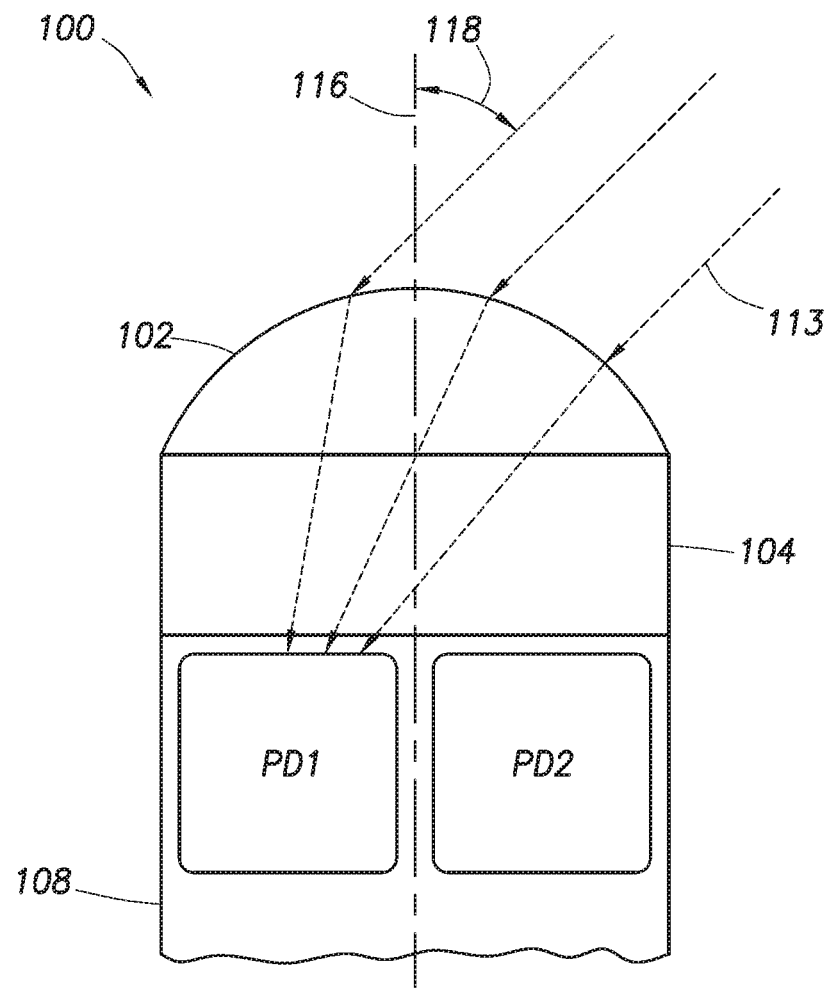

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the image signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

As previously mentioned, the example in FIGS. 2A-2C where phase detection pixel block 100 includes two adjacent pixels is merely illustrative. In another illustrative embodiment, phase detection pixel block 100 may include multiple adjacent pixels that are covered by varying types of microlenses.

Figure 4:
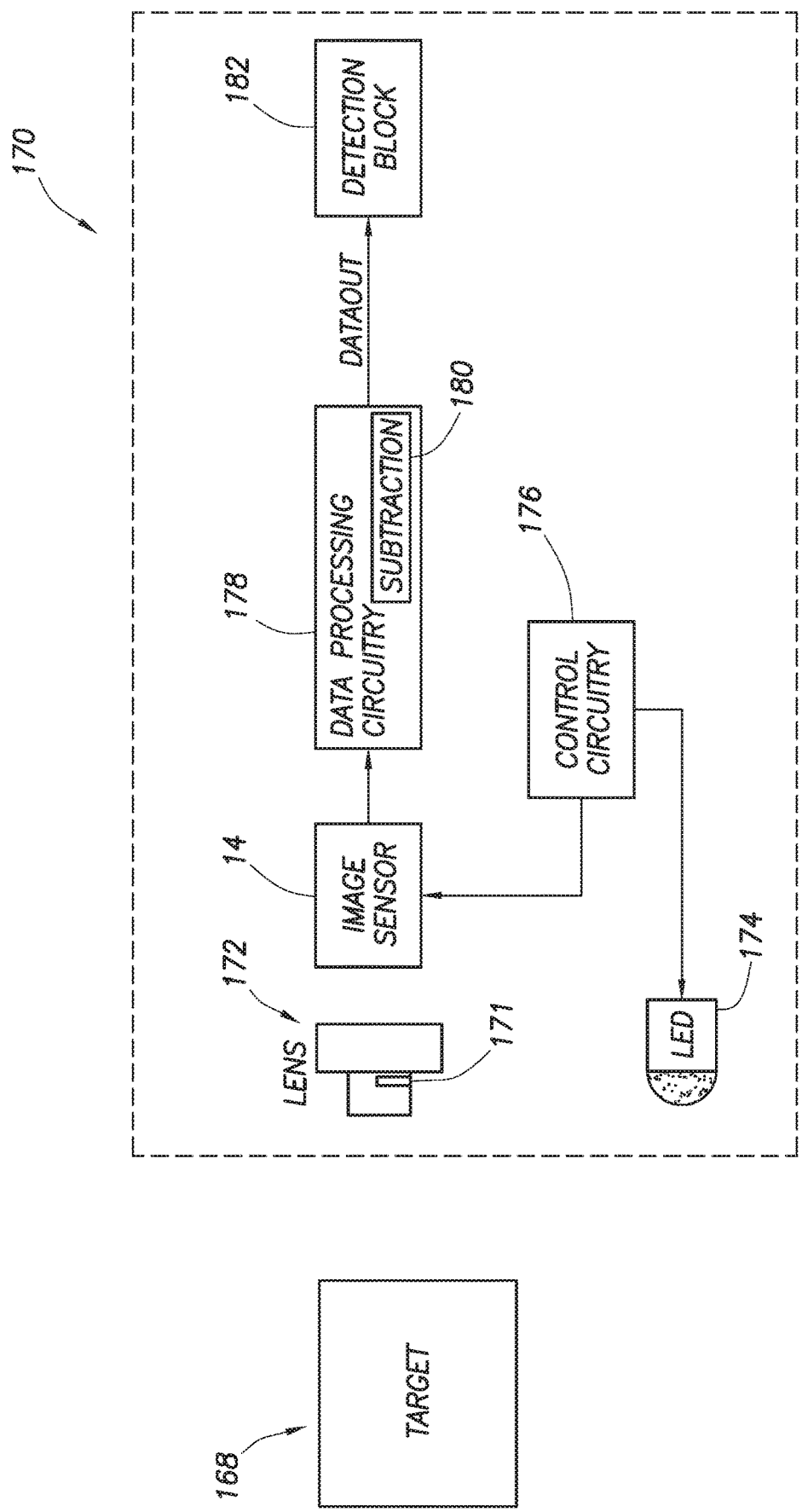
FIG. 4 is a diagram of an illustrative imaging systems having two types of band pass filters for object detection in accordance with an embodiment of the present invention.

FIG. 4 shows an illustrative imaging system (e.g., imaging system 170) that has object detection capabilities. Imaging system 170 may be similar to camera module 12 as described in FIG. 1. As an example, imaging system 170 may be specialized to have object detection functionalities. In particular, imaging system 170 may be used to detect object 168 in a background. Object 168 may be any type of suitable object. For example, object 168 may be a human face, a target object in the foreground, etc.

Imaging system may include image sensor 14. Image sensor 14 may include phase detection pixels (e.g., phase detection blocks) such as the illustrative pixels shown in FIGS. 2A-2C. The phase detection blocks may be arranged in an array (e.g., in a row and column arrangement), for example. If desired, image sensor 14 may include phase detection blocks 100 that include multiple adjacent pixels (e.g., three or more adjacent pixels). Lens system 172 may be formed optically interposed between target 168 and image sensor 14. In particular, phase detection blocks 100 on image sensor 14 may receive incident light though lens system 172.

Lens system 172 may include lenses or optics 28 as described in FIG. 1. Lens system 172 may also include filter system 171. Although lenses 28 are shown to be on both sides, this is merely illustrative. If desired, the lenses 28 may be only on one side of filter system 171, for example. Filter system 171 may include two portions (e.g., first and second portions). The first portion may be a band pass filter (e.g., an optical band pass filter) for a first wavelength (e.g., 850 nm). The second portion may be another band pass filter for a second wavelength (e.g., 940 nm). The filter system may be a circular filter that is split in half (e.g., split on along a line of symmetry) into the first and second portions. The first portion may allow only light near the first wavelength (e.g., wavelengths determined by the bandwidth of the first portion) to pass filter system 171. For example, the bandwidth of an 850 nm band pass filter may be 60 nm from 820 to 880 nm. The second portion may similarly only allow light near the second wavelength (e.g., wavelengths determined by the bandwidth of the second portion) to pass filter system 171. For example, the bandwidth of a 940 nm band pass filter may be 100 nm from 880 nm to 980 nm.

Filter system 171 may be placed at an aperture location within lens system 172, such that the split into first and second portions of filter system 171 is mirrored onto the split of phase detection blocks 100 into Pixel 1 and Pixel 2. For example, Pixel 1 may receive only incident light that has passed the first portion of filter system 171, and Pixel 2 may receive only incident light that has passed the second portion of filter system 171. The split into first and second portions of filter system 171 is similarly mirrored onto all phase detection blocks 100 within image sensor 14, if desired.

Control circuitry 176 may be coupled to image sensor 14 to control reset, signal acquisition, and signal readout operations. Control circuitry 176 may also be coupled to a light source (e.g., light emitting diode or LED 174) to control the power-on timing of LED 174. For example, when control circuitry 176 provides control signals to image sensor 14 to enable signal acquisition, control circuitry 176 may simultaneously ensure LED 174 is powered on (e.g., power LED 174 on). In other words, LED 174 may be on when image sensor 14 acquires signals from incident light.

LED 174 may emit light mainly at a specific wavelength (e.g., having a quantum efficiency that peaks at the specific wavelength). For example, LED 174 may emit at a wavelength that corresponds to (e.g., that is equal to) the first or second wavelength of filter system 171. In particular, if the second portion of filter system 171 is a band pass filter for 940 nm, LED 174 may emit mainly at 940 nm, for example.

Signals generated from image sensor 14 may be provided to data processing circuitry 178. In particular, a single image from may be provided to data processing circuitry 178 to provide object detection for the single frame. The single frame may include signals from both pixel (e.g., Pixel 1 and Pixel 2) within a given pixel pair 100). Data processing circuitry 178 may include subtraction circuitry 180. Subtraction circuitry may subtract signals of a first pixel from those of a second pixel in the given pixel pair 100 for the given frame.

Data processing circuitry 178 may generate signal DATAOUT that includes image data with an identified (e.g., brightened, contrasted with the background, etc.) object (corresponding to object 168). Detection block 182 may receive signal DATA from data processing circuitry 178. Detection block 182 may use the image data with the brightened object to contrast with the background to ascertain the object. For example, detection block 182 may further extract information about the object (e.g., the identity of the object, the size of the objection, etc.).

If desired, data processing circuitry 178 may also perform other processing operations. For example, detection block 182 may adjust the gain of image signals received. Additional filtering may also be performed. For example, a visible cut filter may be formed and used in collecting image signals to improve detection capabilities.

Imaging system 170 as described in FIG. 4 may operate image sensor 14 in either a global shutter or a rolling shutter mode. If desired, LED 174 within system 170 may be continuously on at low-intensity. As such, a control system for controlling flash timing by LED 174 is not necessary, as in conventional system. Because imaging system 170 enables object detection using a single image frame, no frame memory is necessary. In addition, the frame rate for operating imaging system 170 is improved. For the above reasons, the power consumption and cost for system 170 are reduced compared to conventional systems.

Figure 5:
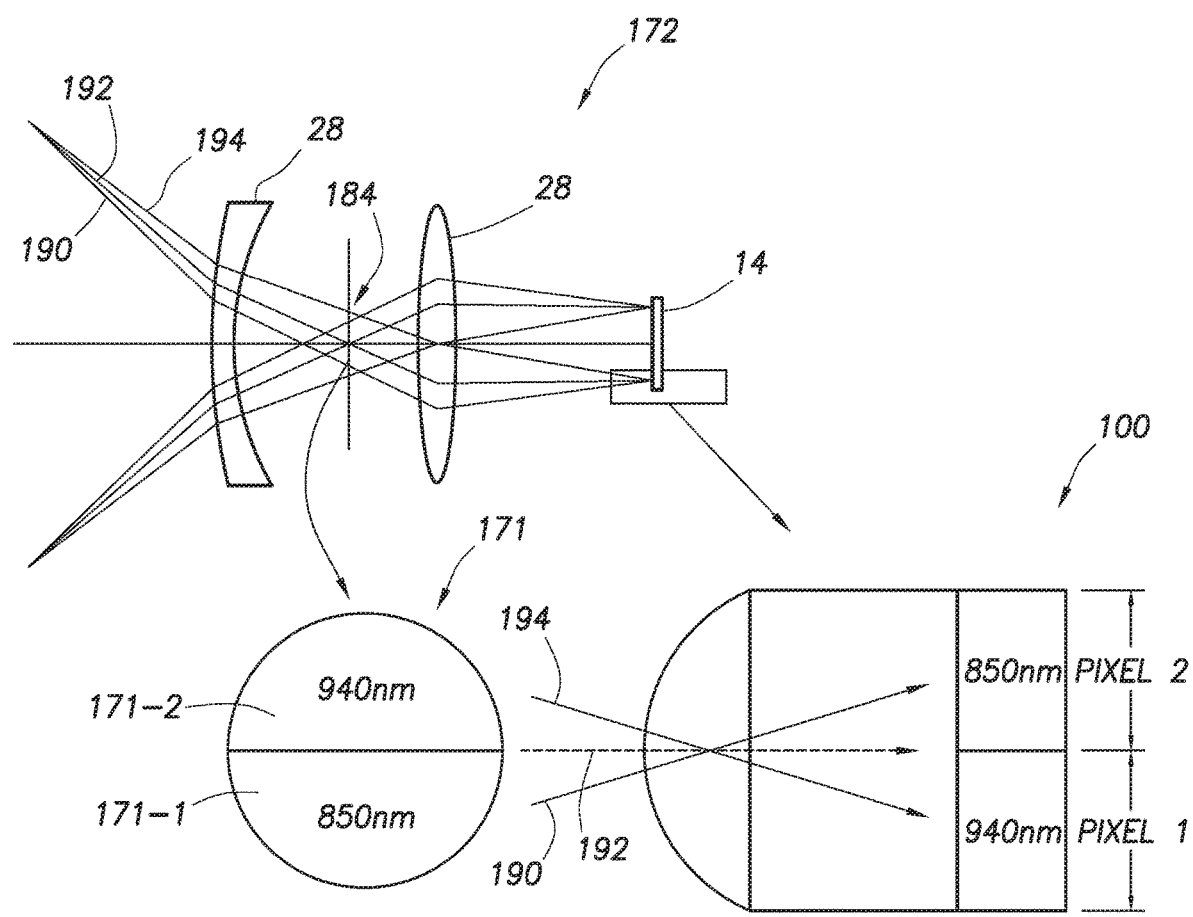
FIG. 5 is a diagram of an illustrative lens system aligned with an image sensor in accordance with an embodiment of the present invention.

FIG. 5 shows a diagram of an illustrative lens system (e.g., lens system 172) that may be within imaging system 170. Lens system 172 may include lenses 28 and aperture 184. Filter system 171 (sometimes referred to herein as band pass filter 171 or filter layer 171) may be place within the aperture 184. Rays 190, 192, and 194 may reach image pixel pair 100 on image sensor 14. Rays 190, 192, and 194 may be conveyed to image pixel pair 100 though filter layer 171. Ray 192 (e.g., sometimes referred to herein as center ray 192) may be aligned to a central axis of filter layer 171 (e.g., between band pass filters 171-1 and 171-2) and consequently a central axis of pixel pair 100 (e.g., between Pixel 1 and Pixel 2).

Band pass filter 171-1 is labeled as an 850 nm band pass filter and Band pass filter 171-1 is labeled as a 940 nm band pass filter. Pixel 1 and Pixel 2 are marked by corresponding wavelengths 940 nm and 850 nm, respectively, to illustrate that the signals collected by Pixel 1 correspond to signals passing through the 940 nm filter and similarly for Pixel 2 and the 850 nm filter. However, this is merely illustrative. If desired, any suitable band pass filter with a suitable bandwidth may be used. Ray 190 may pass though band pass filter 171-1 to reach Pixel 2. For example, ray 190 may be a light ray within the bandwidth of band pass filter 171-1. Similarly, ray 194 may pass band pass filter 171-2 to reach Pixel 1. For example, ray 194 may be a light ray within the bandwidth of band pass filter 171-2.

Figure 6:
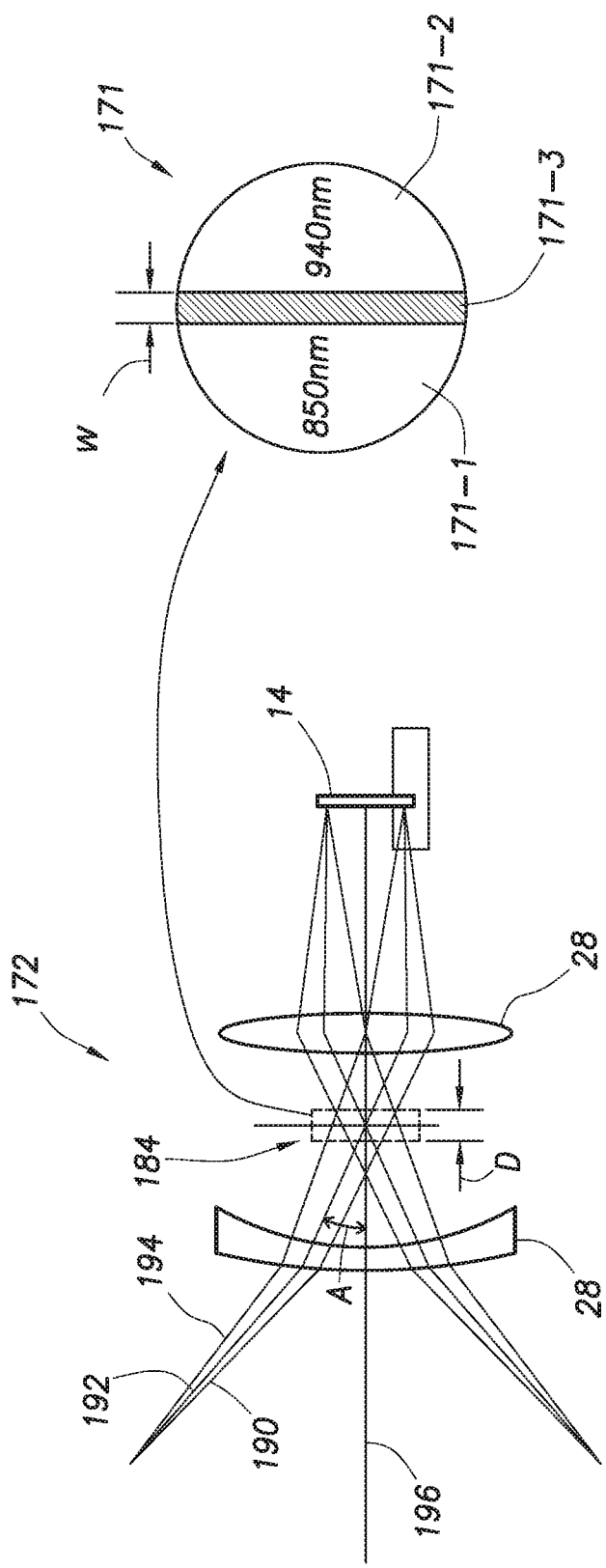
FIG. 6 is a diagram of an illustrative lens system aligned with an image sensor with an increased margin for error in accordance with an embodiment of the present invention.

As shown in FIG. 5, filtering portions 171-1 and 171-2 of filtering layer 171 may be directly adjacent with one another. In accordance with an embodiment, filter portions 171-1 and 171-2 may be separated by black band portion 171-3 as shown in FIG. 6.

To accurately mirror the two filters (e.g., filters 171-1 and 171-2) onto the respective pixels (e.g., Pixel 1 and pixel 2), filter layer 171 should be placed accurately at aperture 184. However, there may be some alignment error (or filter location variation) with an alignment somewhere within limit threshold depth D. In other words, filter layer 171 may be misaligned (e.g., depth-wise misaligned) by up to a distance less than depth D in either direction of aperture 184. By including black band portion 171-3, the alignment error may be accounted for. Width of portion 171-3 (referred to herein as width W) may be calculated as 2 times a variation in depth (referred to herein as variation |D|) further multiplied by the tangent of angle A. Angle A may be defined as the angle between center ray 192 and center axis 196 of lens system 172. In other words, W=2×|D|×tan(A).

Black band portion 171-3 may be formed by forming two different types of band pass filter, one over the other. As such, light that pass one filter, will not pass the other, therefore resulting a dark filter (e.g., an opaque filter, a filter through which no light passes). By forming filter layer 171 with black band 171-3, a location variable up to between depth D may be tolerated during lens assembly.

Furthermore, a collapsible lens structure may be used. The collapsible lens structure may be easier to set a focus than, for example, a screw lens barrel. The collapsible lens structure may be easier for focus adjustment while matching a filter layer separation line (e.g., a line separating filter portions 171-1 and 171-2 in FIG. 5) to a pixel separation line (e.g., a line separating Pixel 1 and pixel 2 in FIG. 5).

Referring to FIGS. 4-6, during operation of imaging system 170, signal corresponding to a first pixel (e.g., Pixel 1) filtered by the first portion of filter system 171 (e.g., filter 171-1) may be collected as a first output signal. Signal corresponding to a second pixel (e.g., Pixel 2) filtered by the second portion of filter system 171 (e.g., filter 171-2) may be collected as a second output signal. A given output signal may be equal to responsivity R of the corresponding band pass filter, multiplied by exposure time T for the corresponding image, and further multiplied by luminescence L for the corresponding image (e.g., Output[n]=R[n]×T×L, Output [850 nm]=R[850 nm]×T×L, Output[940 nm]=R[940 nm]× T×L, etc.).

The responsivity of filter 171-1 divided by the responsivity of filter 171-2 may provide a ratio M used to correlate the performance of the two filters. Ratio M may be obtained by using an image frame (e.g., a standard frame) without LED lighting, for example. Alternatively, a small portion of an image frame used to object detection may be used to obtain ratio M and extend ratio M to (e.g., use ratio M to calibrate) the remaining portion of the image frame as a calibration standard.

In a particular scenario, in which LED 174 emits light at a wavelength at least approximately equaling the wavelength associated with filter 171-2. Image data contrasting an object for recognition (e.g., signal DATAOUT corresponding to object 168) by using LED 174 may be generated by subtracting the first output by the second output scaled by a factor of ratio M. For example, DATAOUT=Output[850 nm]−(M×Output[940 nm]). In the other scenario, in which the wavelength of LED 174 corresponds to the wavelength associated with filter 171-1, signal DATAOUT may be similarly generated (e.g., by reversing all of the variables and performing a similar scaled subtraction).

In particular, signal DATAOUT may include data for an image frame that identifies a target object (e.g., by brightening the target object to contrast with the background). Further object detection analysis and processing may be done downstream at detection block 182 in FIG. 4, for example.

Figure 7A:
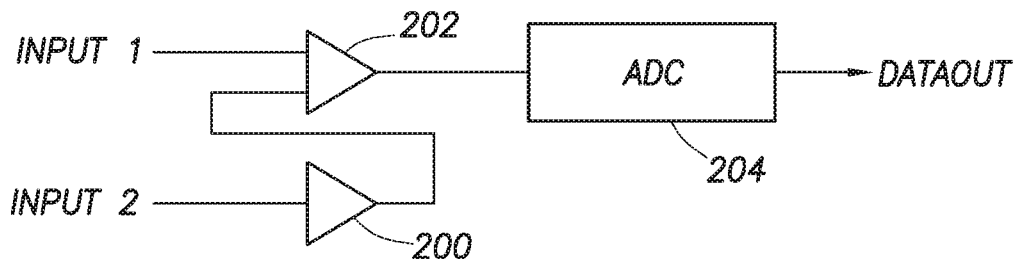
FIGS. 7A-7D are diagrams of illustrative subtraction circuitry and their illustrative operations in accordance with an embodiment of the present invention.
Figure 7B:
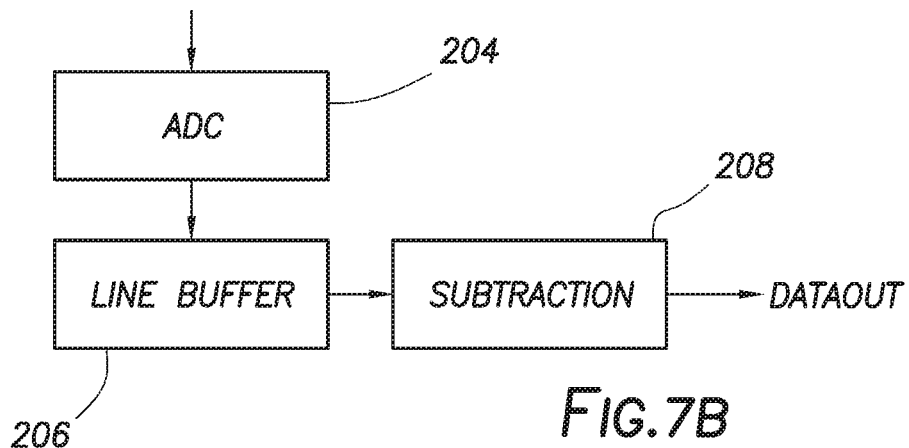
Figure 7C:
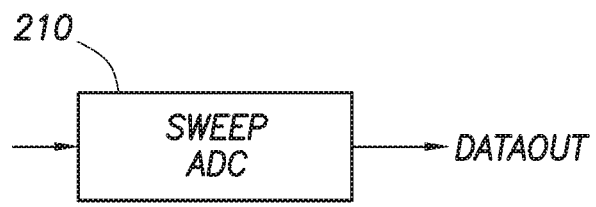

Various schemes for subtracting a scaled (e.g., scaled by ratio M) second output from a first output may be used. FIGS. 7A-7C show three different types of subtraction circuitry that may be implemented within an imaging system, such as imaging system 170 in FIG. 4.

FIG. 7A shows a subtraction scheme, in which an analog subtraction process is performed followed by performing an analog-to-digital conversion process. Subtraction circuitry (e.g., subtraction circuitry 180) may include gain amplifier 200 and differential amplifier 202. Gain amplifier 200 may receive Input 2 (e.g., the second input as previously described) and generate an output that is scaled by a gain (e.g., scaled by a factor of ratio M). Differential amplifier 202 may receive Input 1 as a first input and the output of gain amplifier 200 as a second output. Differential amplifier 202 may subtract the signal received at its second output from the signal received at its first input. As such, the combination of gain amplifier 200 and differential amplifier 202 may perform the desired scaled subtraction.

Differential amplifier 202 may generate an analog output that is the result of the desired scaled subtraction. The analog output of differential amplifier 202 may be received at analog-to-digital converter (ADC) 204. ADC may convert its analog input into a digital output (e.g., DATAOUT). The digital output may be received at detection block 182 in FIG. 4.

In accordance with an embodiment, as shown in FIG. 7B, subtraction circuitry (e.g., subtraction circuitry 180) may include digital subtraction circuitry. The first and second inputs (e.g., Input 1 and Input 2) may be first converted into digital data by using ADC 204. The first and second inputs may be stored at line buffer 206 until a suitable time (e.g., when the first and second digital inputs are completely generated). For example, ADC 204 may receive the first input and correspondingly generate a first digital output. The first digital output may be stored at line buffer 206, while ADC 204 receives the second input and generates a second digital output. The first and second digital inputs may be subsequently received at digital subtraction circuit 208. The second digital input may be scaled by a factor of ratio M. Digital subtraction circuit 208 may then subtract the scaled second digital input from the first digital input to generate digital output DATAOUT.

Figure 7D:
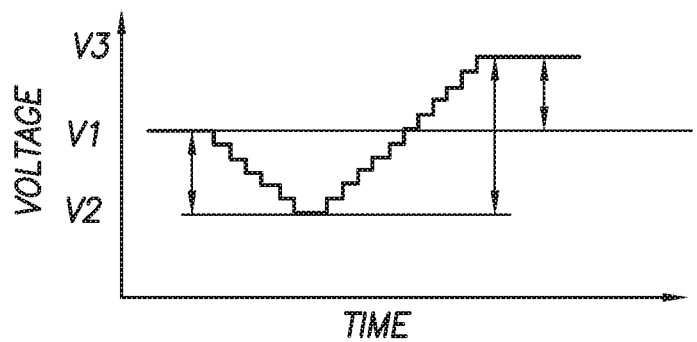

In accordance with an embodiment, subtraction circuitry (e.g., subtraction circuitry 180) may include digital subtract circuitry implemented within an ADC as shown in FIG. 7C. FIG. 7C shows sweep ADC 210 that may sequentially receive the first input and then the second input. The operation of sweep ADC 210 in FIG. 7C is shown in a timing diagram in FIG. 7D.

In particular, in response to receiving the first input, sweep ADC 210 may begin at voltage level V1 (e.g., 0V) and ramp downward (e.g., integrate in a negative voltage polarity direction) to voltage level V2. Voltage level V2 may be determined by the magnitude of the first input.

Then, in response to receiving the second signal, sweep ADC 210 may begin at voltage level V2 and ramp upward (e.g., integrate in a positive voltage polarity direction) to voltage level V3. Voltage level V3 may be determined by the magnitude of the second input scaled by ratio M. By integrating the first and second inputs in such a way, the second input scale by M may be subtracted from the first input, while generating the result in digital form. The digital result is represented by the magnitude of voltage level V3 in the case that voltage level V1 is 0V, for example.

Figure 8:
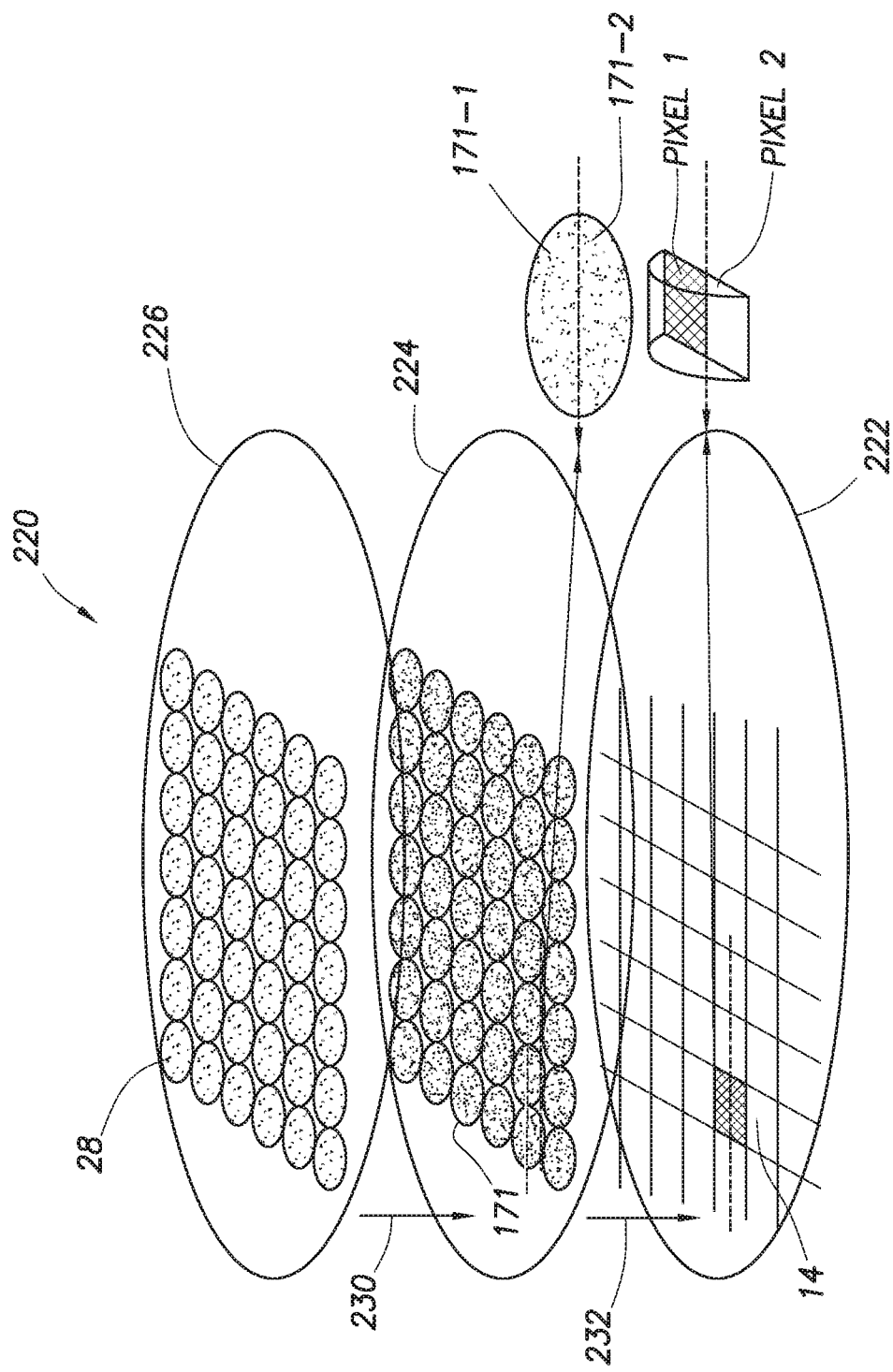
FIG. 8 is a diagram of an illustrative wafer-level assembly of an imaging system for object detection in accordance with an embodiment.

FIG. 8 shows a system of fabricating an image system that includes object detection capabilities. System 220 may include wafers 222, 224, and 226. Wafer 222 may be an image sensor wafer, which includes dies of fabricated arrays of image sensor pixels (e.g., image sensor 14). Wafer 224 may be a filter layer wafer, which may include dies of filter layer 171. Wafer 226 may be a lens system wafer, which may include dies of lenses or optics 28. Wafers 222, 224, and 226 may be silicon wafers, for example. In other words, image sensors, filter layers, and lenses may be fabricated on a silicon substrate. However, this is mere illustrative. If desired, any suitable substrate and any suitable processing technologies may be used to form the corresponding structures on each of the wafers.

For example, wafer 224 may be etched to form an aperture location of the system as previously described. The aperture location may be formed by using a mask and subsequent etching, if desired. The band pass filter may be subsequently formed on wafer 224 at the aperture location.

Wafers 222, 224, and 226 may be attached to on another in a wafer level process. The wafer level process may accurately align each image sensor die to corresponding lenses and filter systems. If desired additional wafers may also be attached. As indicated by arrow 230, lens system wafer 226 may be formed over filter layer wafer 224. As indicated by arrow 232, filter layer wafer 224 may be formed over image sensor wafer 222. The attached system of wafers may be subsequently diced to produce individual dies of "single-chip" imaging systems that have object detection capabilities.

The attached wafer system 220 may include dies of wafer level cameras (e.g., imaging systems). Each individual die may be subsequently packaged. For example, the image sensor die may be packaged, while attached to a lens die and a filter layer die.

The exemplary filter layer 171 having two portions is merely illustrative. As shown in FIG. 9A-9C, imaging system 250 may include lenses 28, filter layer 171, and image sensor 14. If desired, a filter layer (e.g., filter layer 171 in FIG. 9B) may include more than two portions (e.g., three portions, four portions, etc.) that each allow a different wavelength of light through a filter. For example, a filter layer may include four portions (e.g., portions 171-1, 171-2, 171-3, and 171-4).

A first portion (e.g., filter portion 171-1 or simply filter 171-1) may be an 850 nm band pass filter. A second portion (e.g., filter portion 171-2 or simply filter 171-2) may be a 970 nm band pass filter. A third portion (e.g., filter portion 171-3 or simply filter 171-3) may be a 1050 nm band pass filter. A fourth portion (e.g., filter portion 171-4 or simply filter 171-4) may be a clear portion (e.g., a transparent portion, a portion that filters out no light or allows all wavelengths of light through). Image sensor 14 may include multiple pixel detection blocks in a pixel block array. A pixel detection block within image sensor 14 may have four pixels (e.g., Pixels 1-4 of pixel detection block 100-1). The four pixels may be formed under the filter layer with four portions. Analogous to a two-portion filter layer, the four portions of the filter layer may be mirrored onto each respective pixel of the pixel detection block.

The type of band pass filter for each portion of filter layer 171 is merely illustrative. If desired, any suitable band pass filters may be used to isolate specific wavelengths of light.

Similarly, filter layer 171 may be mirrored onto pixel detection blocks 100-2, 100-3, and 100-4. Each pixel detection block may have a single microlens that covers its four pixels (e.g., a single microlens may cover Pixels 1-4 of pixel detection block 100-1). A color filter layer may also be formed over each of pixel detection blocks 100-1, 100-2, 100-3, and 100-4.

The color filter layer may be formed in a Bayer pattern over the pixel detection blocks. For example, a red color filter layer may be formed over Pixel 4 of block 100-1. Pixel 4 may correspond to filter portion 171-4, which is a clear portion. A green color filter layer may be formed over the analogous pixel of block 100-2 (e.g., the bottom-right pixel of block 100-2). A green color filter layer may be formed over the analogous pixel of block 100-3 (e.g., the bottom-right pixel of block 100-3). A blue color filter layer may be formed over the analogous pixel of block 100-4 (e.g., the bottom-right pixel of block 100-4). The bottom-right pixels of blocks 100-2, 100-3, and 100-4 may also all correspond to filter portion 171-4, which is a clear portion.

RGB image data may be collected from the bottom-right pixel of blocks 100-1 to 100-4. Band pass filtered data may be received from the remaining pixels of blocks 1001-1 to 100-4. The example of the color filer layer being Bayer patterned is merely illustrative. If desired, any suitable color filter pattern may be used.

Figure 9:
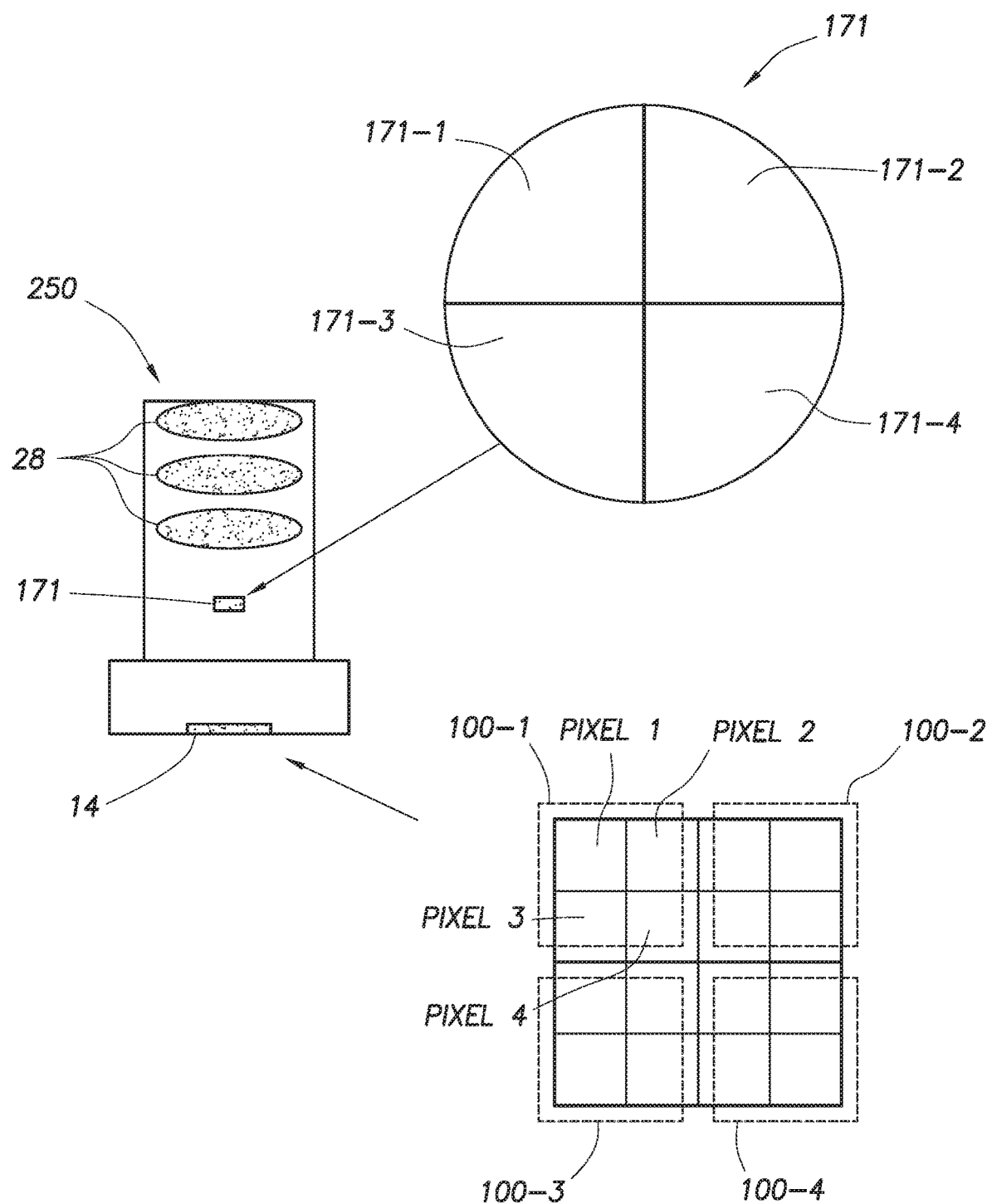
FIG. 9 is a diagram of an illustrative imaging system having more than two types of band pass filters for object detection in accordance with an embodiment of the present invention.

If desired, black band portion 171-3 as shown in FIG. 6 may be analogously included in filter system 171 of FIG. 9. For example, a black band portion may be interposed between any adjacent portions of filter system 171. In particular, a black band portion may be interposed between portions 171-1 and 171-2, between portions 171-2 and 171-4, between portions 171-1 and 171-3, between portions 171-2 and 171-4, or any suitable combination thereof.

Various embodiments have been described illustrating systems and methods relating imaging systems that include object detection capabilities.

In various embodiments of the present invention, an imaging system may include an array of pixel blocks. Each pixel block may include first and second pixels that are covered by a single microlens. Optics or lenses may be formed over the array of pixel blocks, and consequently each pixel within each pixel block. A filter system may be optically interposed between the optics and the microlens. In other words, a filter system (e.g., a filter layer) may be formed over the microlens. In particular, the optics may include an aperture. The filter layer may be formed at the aperture.

The filter layer may include a first filter portion and a second filter portion. The first filter portion may be a band pass filter for a first wavelength. The second filter portion may be a band pass filter for a second wavelength. The imaging system may further include a light source. The light source (e.g., a light emitting diode) may emit light at an object to be detected (e.g., for object detection purposes). The light source may emit light (only) at the second wavelength. Control circuitry may be coupled to the light source and the array of pixel blocks to control a timing of turning the light source on and off. For example, the light source may be continuously on during imaging operations.

The first pixel may receive image light though the first filter portion and generate a first signal. The second pixel may receive the image light through the second filter portion and generate a second signal. Through a standard image, a scaling factor or a scaling ratio between the first and second filter portions may be calculated.

The imaging system may further include processing circuitry, which subtracts a version of the second signal scaled by the scaling factor from the first signal to generate a resulting signal. The processing circuitry may further perform analog to digital conversion on the resulting signal. If desired, the processing circuitry may perform the subtraction and the conversion operation together.

In accordance with an embodiment, a given pixel block may include first, second, third, and fourth pixels, while the corresponding filter layer may include first, second, third and fourth filtering portions. The first and second filtering portions may be as described above. The third filtering portion may be a transparent filter portion (e.g., which allows all light to pass through). The fourth filtering portion may be similar to one of the first and second filtering portions, but may filter a different wavelength. Additionally, a filter layer may include an opaque filter portion interposed between the first and second filter portions. If desired, optics may be formed on a first wafer, a filter system may be formed on a second wafer, and an array of pixels (e.g., an array of pixel blocks) may be formed on a third wafer. The first, second, and third wafers maybe coupled to each other during a wafer-level processing step.

The foregoing is merely illustrative of the principles of this invention and various modifications can be made by those skilled in the art without departing from the scope and spirit of the invention.

What is claimed is:

1. A method of determining the presence of an object within an image using an imaging system that includes first and second pixels, a microlens formed over the first and second pixels, and a filter layer formed over the microlens, the method comprising:
   with the first pixel, generating a first signal in response to incident light received through a first portion of the filter layer;
   with the first portion of the filter layer, passing light of a first wavelength to the first pixel while blocking light of a second wavelength;
   with the second pixel, generating a second signal in response to incident light received through a second portion of the filter layer;
   with the second portion of the filter layer, passing the light of the second wavelength to the second pixel while blocking the light of the first wavelength; and
   using processing circuitry, performing a subtraction operation based on the second signal and the first signal to generate object detection data, wherein performing the subtraction operation comprises subtracting a scaled version of the second signal from the first signal.

2. The method of claim 1, wherein generating the second signal comprises generating the second signal while simultaneously generating the first signal.

3. The method of claim 1, further comprising:
   using a light source, emitting light to brighten the object.

4. The method of claim 1, wherein the scaled version of the second signal is generated based on a scaling factor determined based on the first and second portions of the filter layer.

5. The method of claim 4, further comprising:
   using the processing circuitry, performing analog to digital conversion operations to generate the object detection data.

6. The method of claim 1, wherein the first signal comprises an analog signal generated in response to incident light at the first wavelength and wherein the second signal comprises an analog signal generated in response to incident light at the second wavelength.

7. A system, comprising:
   processing circuitry;
   a lens;
   a filter layer;
   an array of pixels, wherein the lens is configured to focus image light received through the filter layer onto the array of pixels, and wherein the array of pixels is operable to generate analog signals in response the image light; and
   a microlens formed over first and second pixels in the array of pixels, wherein the microlens is interposed between the filter layer and the array of pixels, and wherein the filter layer comprises:
   first filter portion configured to pass light of a first wavelength and block light of a second wavelength;
   a second filter portion configured to pass the light of the second wavelength and block the light of the first wavelength, and wherein the first wavelength is different from the second wavelength; and
   a black band portion that is opaque, wherein the first filter portion is separated from the second filter portion by a distance and the black band portion spans the distance.

8. The system of claim 7, further comprising:
   a light source operable to emit light at the first wavelength, wherein the first pixel is configured to receive image light at the first wavelength through the first filter portion and to generate a first signal in response to the image light at the first wavelength.

9. The system of claim 8, wherein the second pixel is configured to receive image light at a second wavelength through the second filter portion and to generate a second signal in response to the image light at the second wavelength.

10. The system of claim 9, wherein the processing circuitry is operable to subtract a scaled version of the first signal from the second signal to generate object detection data.

11. The system of claim 10, further comprising:
control circuitry that is coupled to the light source and the array of pixels.

12. The system of claim 11, wherein the lens is formed on a first wafer, wherein the filter layer is formed on a second wafer, wherein the array of pixels is formed on a third wafer, and wherein the first, second, and third wafers are stacked.

13. The system of claim 7, wherein the filter layer is interposed between the lens and the micro lens.

14. The system of claim 7, wherein the lens forms a portion of a lens system comprising an aperture and the filter layer is formed at the aperture.

15. The system of claim 7, further comprising:
a light source operable to emit light at the first wavelength towards an object for detection.

16. The system of claim 15, wherein the light source is operable to be continuously on during object detection.

17. A system, comprising:
processing circuitry;
a lens;
a filter layer;
an array of pixels, wherein the lens focuses image light received through the filter layer onto the array of pixels, and wherein the array of pixels generates analog signals in response the image light;
a microlens formed over first and second pixels in the array of pixels, wherein the filter layer is formed over the microlens; and
a light source that emits light at a first wavelength, wherein the first pixel receives image light at the first wavelength through a first portion of the filter layer and generates a first signal in response to the image light at the first wavelength, wherein the second pixel receives image light at a second wavelength different from the first wavelength and generates a second signal in response to the image light at the second wavelength, wherein the processing circuitry is configured to subtract a scaled version of the first signal from the second signal to generate an object detection signal and to generate object detection data by performing analog to digital conversion based on the object detection signal.

* * * * *